(12) United States Patent
Kim (10) Patent No.: US 8,330,361 B2
(45) Date of Patent: Dec. 11, 2012

(54) ORGANIC LIGHT EMITTING DIODE DISPLAY WITH A PLURALITY OF CONDENSERS

(75) Inventor: Eun-Ah Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 932 days.

(21) Appl. No.: 12/410,287

(22) Filed: Mar. 24, 2009

(65) Prior Publication Data
US 2010/0045575 A1 Feb. 25, 2010

(30) Foreign Application Priority Data

Aug. 19, 2008 (KR) ........................ 10-2008-0080908

(51) Int. Cl.
*H01J 1/62* (2006.01)
*H01J 63/04* (2006.01)

(52) U.S. Cl. ........ 313/512; 313/483; 313/500; 313/501; 313/502; 313/503; 313/504; 313/505; 313/506

(58) Field of Classification Search ........................ None
See application file for complete search history.

(56) References Cited

U.S. PATENT DOCUMENTS

| | | | |
|---|---|---|---|
| 6,724,150 B2* | 4/2004 | Maruyama et al. | 315/169.3 |
| 7,492,092 B2* | 2/2009 | Yamauchi | 313/506 |
| 7,652,683 B2* | 1/2010 | Akagawa et al. | 347/238 |
| 7,733,019 B2* | 6/2010 | Song et al. | 313/512 |
| 2004/0160165 A1 | 8/2004 | Yamauchi | |

FOREIGN PATENT DOCUMENTS

| | | |
|---|---|---|
| CN | 1357868 A | 7/2002 |
| CN | 1525212 A | 9/2004 |
| EP | 1 589 584 A2 | 10/2005 |
| JP | 2001-109403 | 4/2001 |
| JP | 2004-077778 | 3/2004 |
| JP | 2004-310051 | 11/2004 |
| JP | 2005-310749 | 11/2005 |
| JP | 2006-205364 | 8/2006 |
| JP | 2007-030290 | 2/2007 |
| KR | 10-0712182 B1 | 4/2007 |
| WO | WO 2006/022273 A2 | 3/2006 |

* cited by examiner

*Primary Examiner* — Natalie Walford
(74) *Attorney, Agent, or Firm* — Christie, Parker & Hale, LLP (57) ABSTRACT

Exemplary embodiments of the present invention relate to an OLED display. The OLED display according to exemplary embodiments of the present invention includes: a substrate; a plurality of pixel electrodes on the substrate; a pixel defining layer on the substrate and having a plurality of openings exposing the plurality of pixel electrodes; a plurality of organic emission layers on corresponding pixel electrodes of the plurality of pixel electrodes; a sealing member including a plurality of concave lens containers and covering the plurality of organic emission layers and the pixel defining layer; and at least one condenser in the plurality of lens containers. The at least one condenser is configured to form a condensing area on the pixel defining layer for each of the plurality of lens containers.

16 Claims, 8 Drawing Sheets

ORGANIC LIGHT EMITTING DIODE DISPLAY WITH A PLURALITY OF CONDENSERS

CROSS-REFERENCE TO RELATED APPLICATION

This application claims priority to and the benefit of Korean Patent Application No. 10-2008-0080908 filed in the Korean Intellectual Property Office on Aug. 19, 2008, the entire contents of which are incorporated herein by reference.

BACKGROUND OF THE INVENTION

1. Field of the Invention

The present invention relates to an organic light emitting diode (OLED) display with improved visibility.

2. Description of the Related Art

OLED displays include a plurality of organic light emitting diodes (OLEDs) including hole injection electrodes, an organic light emission layer, and electron injection electrodes. Light is emitted by energy generated when excitons generated from combining electrons and holes drop from an excited state to a ground state, and the OLED display displays an image by using the light.

Accordingly, OLED displays have self-luminance characteristics, and unlike liquid crystal displays (LCDs), the thickness and weight of OLED displays can be reduced since a separate light resource is not required. Further, because OLED displays have high quality characteristics such as low power consumption, high luminance, and high reaction speed, OLED displays are more appropriate for use in mobile electronic devices.

In general, hole injection electrodes, electron injection electrodes, and other metal wires of an OLED display can reflect external light. Therefore, when an OLED display is used in a bright place, expression of black color and contrast of the OLED display are deteriorated due to reflection of external light.

In order to solve such a problem, a polarizing plate and a phase delay plate are provided to suppress reflection of external light. However, when suppressing external light reflection by using the polarizing plate and the phase delay plate, light generated from an organic emission layer is lost when emitted out through the polarizing plate and the phase delay plate.

The above information disclosed in this Background section is only for enhancement of understanding of the background of the invention, and therefore may contain information that does not form the prior art that is already known in this country to a person of ordinary skill in the art.

SUMMARY OF THE INVENTION

Exemplary embodiments of the present invention provide an organic light emitting diode (OLED) display having improved visibility.

An exemplary OLED display according to one embodiment of the present invention includes: a substrate; a plurality of pixel electrodes on the substrate; a pixel defining layer on the substrate and having a plurality of openings exposing the plurality of pixel electrodes; a plurality of organic emission layers on corresponding pixel electrodes of the plurality of pixel electrodes; a sealing member including a plurality of concave lens containers and covering the plurality of organic emission layers and the pixel defining layer; and at least one condenser in the plurality of lens containers, wherein the at least one condenser is configured to form a condensing area on the pixel defining layer for each of the plurality of lens containers.

The pixel defining layer may include a light absorbing material.

The OLED display may further include a light blocker at each condensing area. The OLED display may further include a charging member between the sealing member and the pixel defining layer, wherein the light blocker at each condensing area is formed on the charging member.

One condenser may cover the plurality of pixel electrodes.

Each of the plurality of lens containers of the sealing member may have a cylindrical surface or a spherical surface, and the at least one condenser may be defined by the plurality of lens containers.

The at least one condenser may include a charging member and may be between the sealing member and the pixel defining layer.

In the OLED display, the plurality of lens containers may face the plurality of organic emission layers.

The at least one condenser may include a material with a refractive index greater than a refractive index of the sealing member.

In the OLED display, the plurality of lens containers may face away from the organic emission layer.

The at least one condenser may include a material with a refractive index less than a refractive index of the sealing member.

An exemplary OLED display according to another embodiment of the present invention includes: a substrate; a plurality of pixel electrodes on the substrate; a pixel defining layer on the substrate and having a plurality of openings exposing the plurality of pixel electrodes; a plurality of organic emission layers on corresponding pixel electrodes of the plurality of pixel electrodes; a sealing member including a plurality of concave lens containers and covering the plurality of organic emission layers and the pixel defining layer; and a plurality of condensers in corresponding ones of the plurality of lens containers, wherein each of the plurality of condensers is configured to form a condensing area on the pixel defining layer.

Therefore, according to exemplary embodiments of the present invention, visibility of an OLED display can be improved by suppressing or reducing reflection of external light.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways without departing from the spirit or scope of the present invention.

In addition, the size and the thickness of each element in the drawings serve as examples for better understanding and ease of description, and the present invention is not limited thereto.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element, or one or more intervening elements may also be present.

The drawings and description are to be regarded as illustrative in nature and not restrictive. Like reference numerals designate like elements throughout the specification.

In the several exemplary embodiments, constituent elements having the same configuration are representatively described in a first exemplary embodiment by designating like constituent elements thereto, and other exemplary embodiments will be described regarding differences from the first exemplary embodiment.

In addition, in the accompanying drawings, an organic light emitting diode (OLED) display is illustrated as an active matrix (AM)-type OLED display in a 2Tr-1Cap structure in which two thin film transistors (TFTs) and one capacitor are formed in one pixel, but the present invention is not limited thereto. Therefore, the OLED display can have various structures. For example, three or more TFTs and two or more capacitors can be provided in one pixel of the OLED display, and separate wires can be further provided in the OLED display.

Here, the pixel may refer to a minimum unit for displaying an image, and an OLED display displays an image by using a plurality of pixels.

Hereinafter, a first exemplary embodiment of the present invention will be described with reference to FIG. 1 through FIG. 5.

Figure 1:
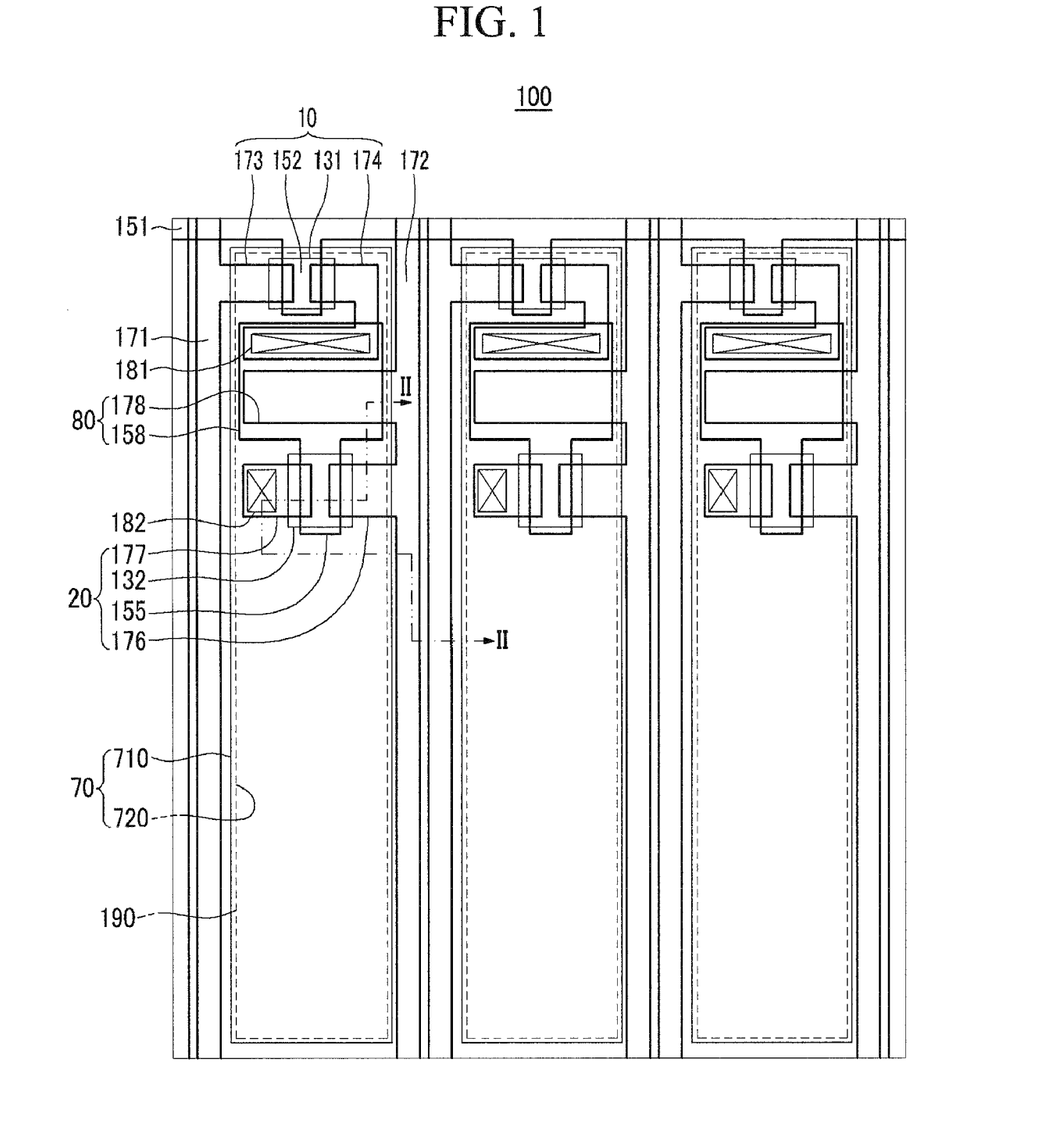
FIG. 1 is a layout view of an organic light emitting diode (OLED) display according to a first exemplary embodiment of the present invention.
Figure 2:
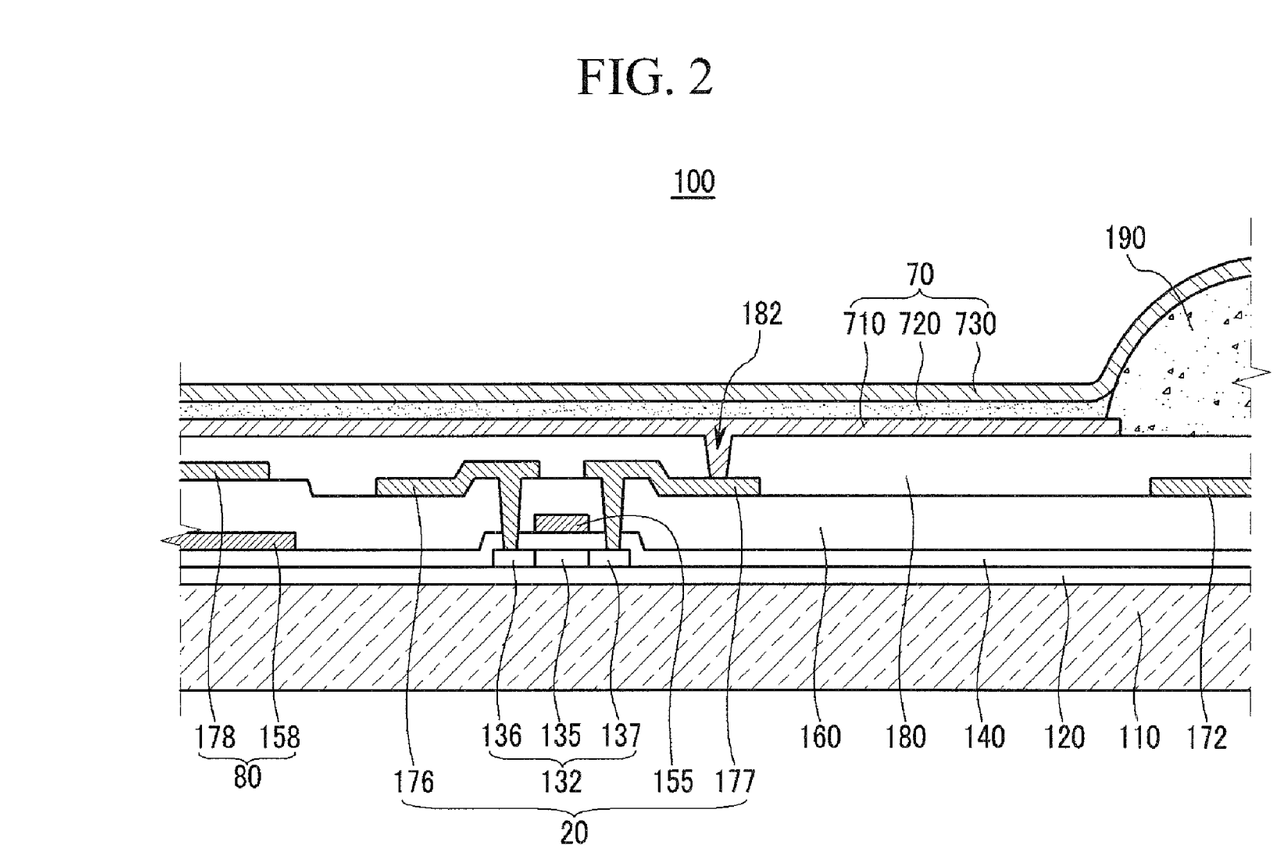
FIG. 2 is a cross-sectional view of FIG. 1, taken along the line II-II.

Referring to FIG. 1 and FIG. 2, a description of a basic structure of an organic light emitting diode (OLED) display according to the first exemplary embodiment of the present invention will be focused on thin film transistors 10 and 20 and an OLED 70. A sealing member 210 and a condenser 310 (i.e., a light condenser) of the OLED display 100 according to the first exemplary embodiment of the present invention will be described with reference to FIG. 3 and FIG. 4, respectively.

As shown in FIG. 1, the OLED display 100 includes a switching thin film transistor 10, a driving thin film transistor 20, a capacitor 80, and an OLED 70 for one pixel. In addition, the OLED display 100 further includes gate lines 151 extending in one direction, and data lines 171 and common power lines 172 that respectively cross the gate lines 151 and insulated therefrom. Here, one pixel can be defined by a boundary of a gate line 151, a data line 171, and a common power line 172.

The OLED 70 includes a pixel electrode 710, an organic emission layer 720 formed on the pixel electrode 710, and a common electrode (730 of FIG. 2) formed on the organic emission layer 720. Here, the pixel electrode 710 is an anode (+) electrode which is a hole injection electrode, and the common electrode 730 is a cathode (−) electrode which is an electron injection electrode. However, the present invention is not limited thereto, for example, the pixel electrode 710 can be the cathode electrode and the common electrode 730 can be the anode electrode according to an alternate driving method of the OLED display 100. Holes and electrons are respectively injected from the pixel electrode 710 and the common electrode 730 into the organic emission layer 720 to form excitons. When the excitons change from an excited state to a base state, light is emitted.

The switching thin film transistor 10 includes a switching semiconductor layer 131, a switching gate electrode 152, a switching source electrode 173, and a switching drain electrode 174, and the driving thin film transistor 20 includes a driving semiconductor layer 132, a driving gate electrode 155, a driving source electrode 176, and a driving drain electrode 177.

The capacitor 80 includes a first sustain electrode 158 and a second sustain electrode 178 that are disposed with an interlayer insulation layer (160 of FIG. 2) interposed therebetween.

The switching thin film transistor 10 is used as a switch for selecting pixels to be light-emitted. The switching gate electrode 152 is connected to the gate line 151. The switching source electrode 173 is connected to the data line 171. The switching drain electrode 174 is disposed at a distance from the switching source electrode 173, and is connected to the first sustain electrode 158.

The driving thin film transistor 20 applies driving power for light emission of an organic emission layer 720 of an OLED 70 in the selected pixel to the pixel electrode 710. The driving gate electrode 155 is connected to the first sustain electrode 158. The driving source electrode 176 and the second sustain electrode 178 are respectively connected to the common power line 172. The driving drain electrode 177 is connected to the pixel electrode 710 of the OLED 70 through a contact hole 182.

With the above-described structure, the switching thin film transistor 10 is driven to transmit a data voltage applied to the data line 171 to the driving thin film transistor 20 by a gate voltage applied to the gate line 151. A voltage that corresponds to a voltage difference between a common voltage transmitted from the common power line 172 to the driving thin film transistor 20 and the data voltage transmitted from the switching thin film transistor 10 is stored in the capacitor 80, and a current corresponding to the voltage stored in the capacitor 80 flows to the OLED 70 through the driving thin film transistor 20 so that OLED 70 emits light.

Referring to FIG. 2, a basic structure of the OLED display 100 will now be described in further detail. FIG. 2 focuses on the driving thin film transistor 20, the OLED 70, and the capacitor 80 of the OLED display 100.

Hereinafter, a structure of a thin film transistor will be described in further detail with reference to the driving thin film transistor 20. In addition, the switching thin film transistor 10 will be described in further detail with respect to differences from the driving thin film transistor 20.

A substrate 110 is formed as an insulation substrate that is made of glass, quartz, ceramic, plastic, etc. However, the present invention is not limited thereto. Therefore, the substrate 110 can be formed as, for example, a metal substrate that is made of stainless steel.

A buffer layer 120 is formed on the substrate 110. The buffer layer 120 prevents impurities from permeating and planarizes a surface, and is made of various materials for performing such a function. For example, one of a silicon nitride (SiNx) layer, a silicon dioxide ($SiO_2$) layer, or a silicon oxynitride (SiOxNy) layer can be used as the buffer layer 120. However, the buffer layer 120 is not always necessary, and may be omitted according to type and process conditions of the substrate 110.

The driving semiconductor is formed on the driving buffer layer 120. The driving semiconductor layer 132 is formed of a polysilicon layer. In addition, the driving semiconductor layer 132 includes a channel region 135 in which impurities are not doped, and a source region 136 and a drain region 137 that are doped with p+ impurities at respective sides of the channel region 135. In this case, a doped ion material is a P-type impurity such as boron (B), and $B_2H_6$ is generally used as the doped ion material. The impurity changes in accordance with the type of thin film transistor.

In the first exemplary embodiment of the present invention, a PMOS-structured thin film transistor using the P-type impurity is used as the driving thin film transistor 20, but is not limited thereto. Therefore, an NMOS-structured thin film transistor or a CMOS-structured thin film transistor both can be used as the driving thin film transistor 20.

In addition, although the driving thin film transistor 20 of FIG. 2 is a polycrystalline thin film transistor including a polysilicon layer, the switching thin film transistor 10 (not shown in FIG. 2) may be a polycrystalline thin film transistor or an amorphous thin film transistor including an amorphous silicon layer.

The gate insulation layer 140 made of silicon nitride (SiNx) or silicon dioxide ($SiO_2$) is formed on the driving semiconductor layer 132. A gate layer including the driving gate electrode 155 is formed on the gate insulating layer 140. The gate layer further includes the gate line (151 of FIG. 1), the first sustain electrode 158, and other wires. In addition, the driving gate electrode 155 is formed to overlap at least a part of the driving semiconductor layer 132, and specifically, is formed to overlap the channel region 135.

An interlayer insulation layer 160 that covers the driving gate electrode 155 is formed on the gate insulating layer 140. The gate insulating layer 140 and the interlayer insulating layer 160 share through-holes exposing the source region 136 and the drain region 137 of the driving semiconductor layer 132. Like the gate insulation layer 140, the interlayer insulating layer 160 is made of silicon nitride (SiNx) or silicon dioxide ($SiO_2$).

A data layer including the driving source electrode 176 and the driving drain electrode 177 is formed on the interlayer insulating layer 160. The data layer further includes the data line (171 of FIG. 1), the common power line 172, the second sustain electrode 178, and other wires. In addition, the driving source electrode 176 and the driving drain electrode 177 are respectively connected to the source region 136 and the drain region 137 of the driving semiconductor layer 132 through the through-holes.

As described, the driving thin film transistor 20 including the driving semiconductor layer 132, the gate electrode 155, the driving source electrode 176, and the driving drain electrode 177 is formed.

A configuration of the driving thin film transistor 20 is not limited to the above-described embodiment, and can be variously modified with a configuration that can be realized by a person of ordinary skill in the art.

A planarization layer 180 that covers the data wires 172, 176, 177, and 178 is formed on the interlayer insulating layer 160. The planarization layer 180 removes steps and performs planarization in order to increase luminous efficiency of the OLED 70. In addition, the planarization layer 180 has a contact hole 182 through which the drain electrode 177 is partially exposed.

The planarization layer 180 can be made of at least one of polyacrylates resin, epoxy resin, phenolic resin, polyamide resin, polyimide resin, unsaturated polyesters resin, poly phenylenethers resin, poly phenylenesulfide resin, or benzocyclobutene (BCB).

The pixel electrode 710 of the OLED 70 is formed on the planarization layer 180. The pixel electrode 710 is connected to the drain electrode 177 through the contact hole 182 of the planarization layer 180.

In addition, a pixel defining layer 190 having an opening that defines the pixel electrode 710 is formed on the planarization layer 180. That is, the pixel electrode 710 corresponds to the opening of the pixel defining layer 190.

The pixel defining layer 190 can be made of an inorganic material of a resin or silica group such as polyacrylate resin or polyimide. In addition, the pixel defining layer may include a light absorbing material. That is, the pixel defining layer may include a black pigment to block light. Here, the black pigment may include carbon black, titanium oxide, and the like. Various known materials that can be realized by a person of ordinary skill in the art can be used as the light absorption material.

The organic emission layer 720 is formed on the pixel electrode 710 in the opening of the pixel defining layer 190, and the common electrode 730 is formed on the pixel defining layer 190 and the organic emission layer 720.

In this manner the OLED 70 including the pixel electrode 710, the organic emission layer 720, and the common electrode 730 is formed.

One of the pixel electrode 710 and the common electrode 730 can be made of a transparent conductive material, and the other can be made of a transflective or reflective conductive material. According to materials of the pixel electrode 710 and the common electrode 730, the OLED display 100 can be classified as a top light emitting type, a bottom light emitting type, and a dual-side light emitting type. The OLED display 100 according to the first exemplary embodiment of the present invention is a top light emitting type of OLED display.

For the transparent conductive material, at least one of indium tin oxide (ITO), indium zinc oxide (IZO), zinc oxide (ZnO), or indium oxide ($In_2O_3$) may be used. For the reflective material, at least one of lithium (Li), calcium (Ca), fluorinated lithium/calcium (LiF/Ca), fluorinated lithium/aluminum (LiF/Al), aluminum (Al), silver (Ag), magnesium (Mg), or gold (Au) may be used.

The organic emission layer 720 is made of either a low-molecular organic material or a high-molecular organic material. Such an organic emission layer 720 is formed in a multi-layer structure including a hole injection layer (HIL), a hole transport layer (HTL), an emission layer, an electron transport layer (ETL), and an electron injection layer (EIL). That is, the HIL is disposed on the pixel electrode 710 which is a positive electrode, and the HTL, the emission layer, the ETL, and the EIL may be sequentially stacked thereon.

A sealing member and a condenser of the OLED display according to the first exemplary embodiment of the present invention will be described with reference to FIG. 3 to FIG. 5.

Figure 3:
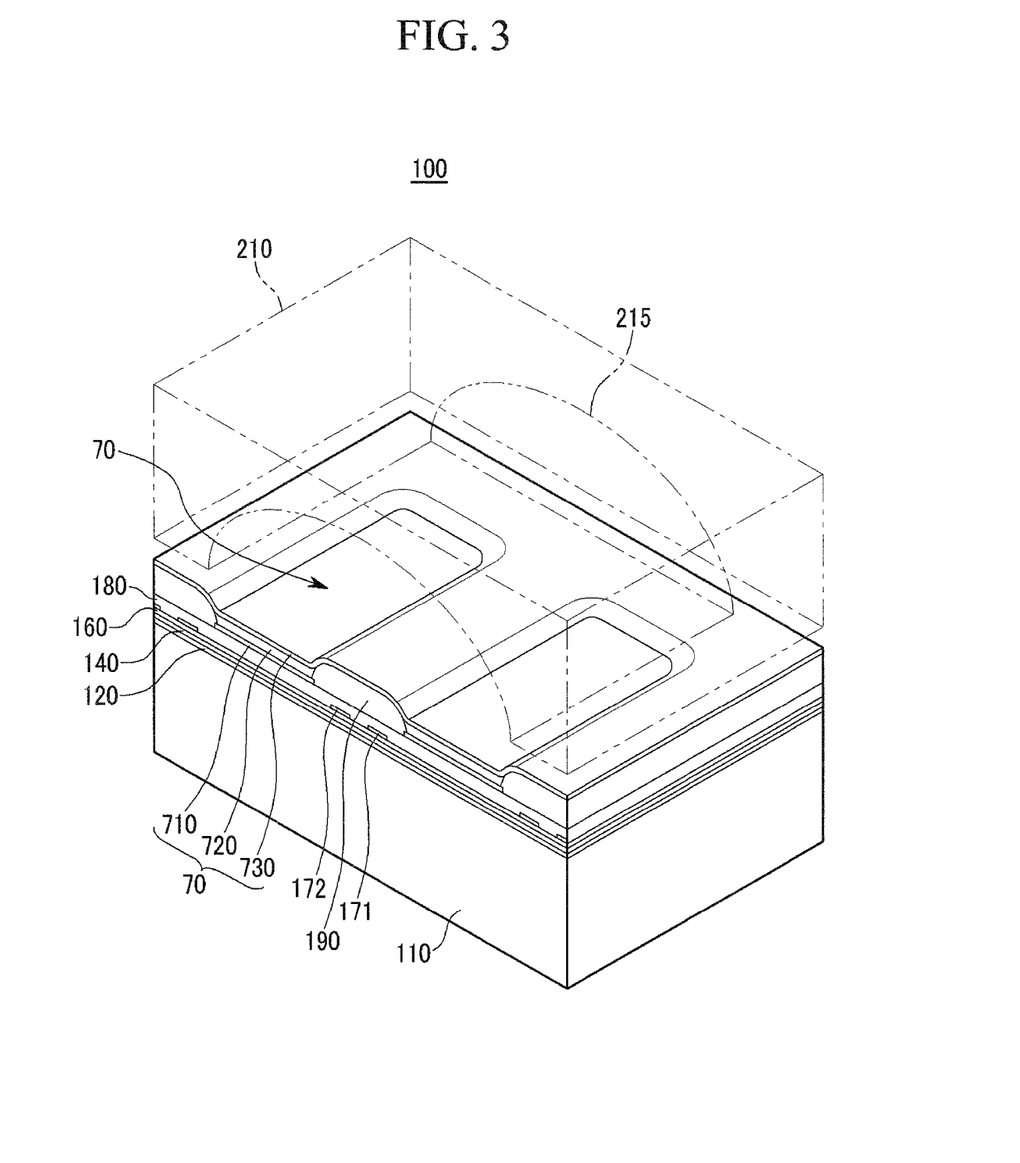
FIG. 3 is a partial perspective view of the OLED display of FIG. 1.

As shown in FIG. 3, the sealing member 210 covers the thin film transistors 10 and 20 of FIG. 1 and FIG. 2 and the OLED 70 formed on the substrate 110 to protect the various components from external environment conditions. In addition, the sealing member 210 includes a plurality of concave lens containers 215. In this case, each lens container 215 is formed on one side of a sealing member 210, facing the OLED 70 that includes the organic emission layer 720. In addition, the lens container 215 has a spherical shape. In further detail, the lens container 215 becomes gradually deeper toward the center thereof, and a cross-section thereof has a half-circle or half-oval shape.

Figure 4:
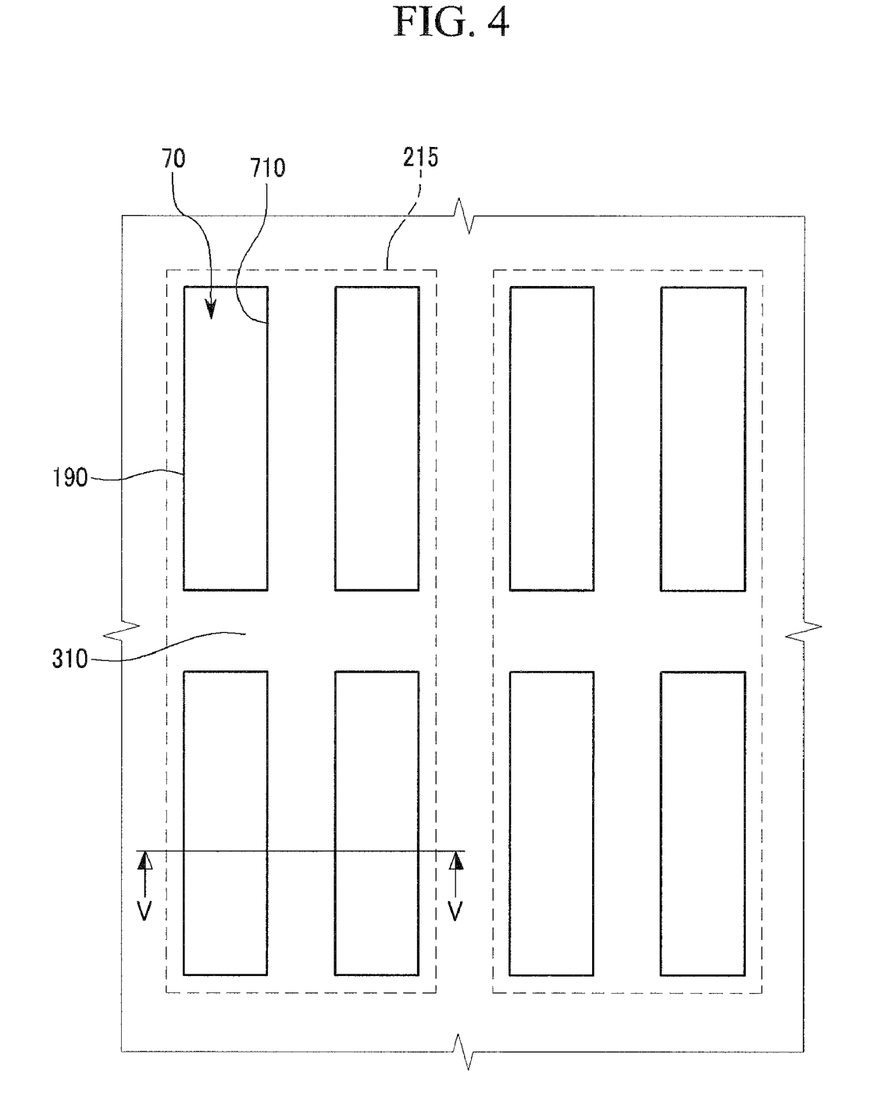
FIG. 4 is a top plan view showing a location of a condenser of the OLED display of FIG. 1.

As shown in FIG. 4, one of the lens containers 215 covers a plurality of pixel electrodes 710. In addition, a condenser 310 is disposed in each of the plurality of lens containers 215. Therefore, one of the condensers 310 covers a plurality of pixel electrodes 710.

Alignment of the plurality of pixel electrodes 710 covered by the lens container 215 and the condenser 310 is not limited to the alignment shown in FIG. 4. That is, the lens container 215 and the condenser 310 may cover more or less than two pixel electrodes 710 in the horizontal and/or vertical directions.

In addition, a portion in which the pixel defining layer 190 is formed is substantially equivalent to other portions, excluding a portion where the pixel electrode 710 is formed. However, the pixel defining layer 190 and the pixel electrode 710 may overlap each other in an area that includes a boundary of the portions where the pixel defining layer 190 and the pixel electrode 710 are formed.

Figure 5:
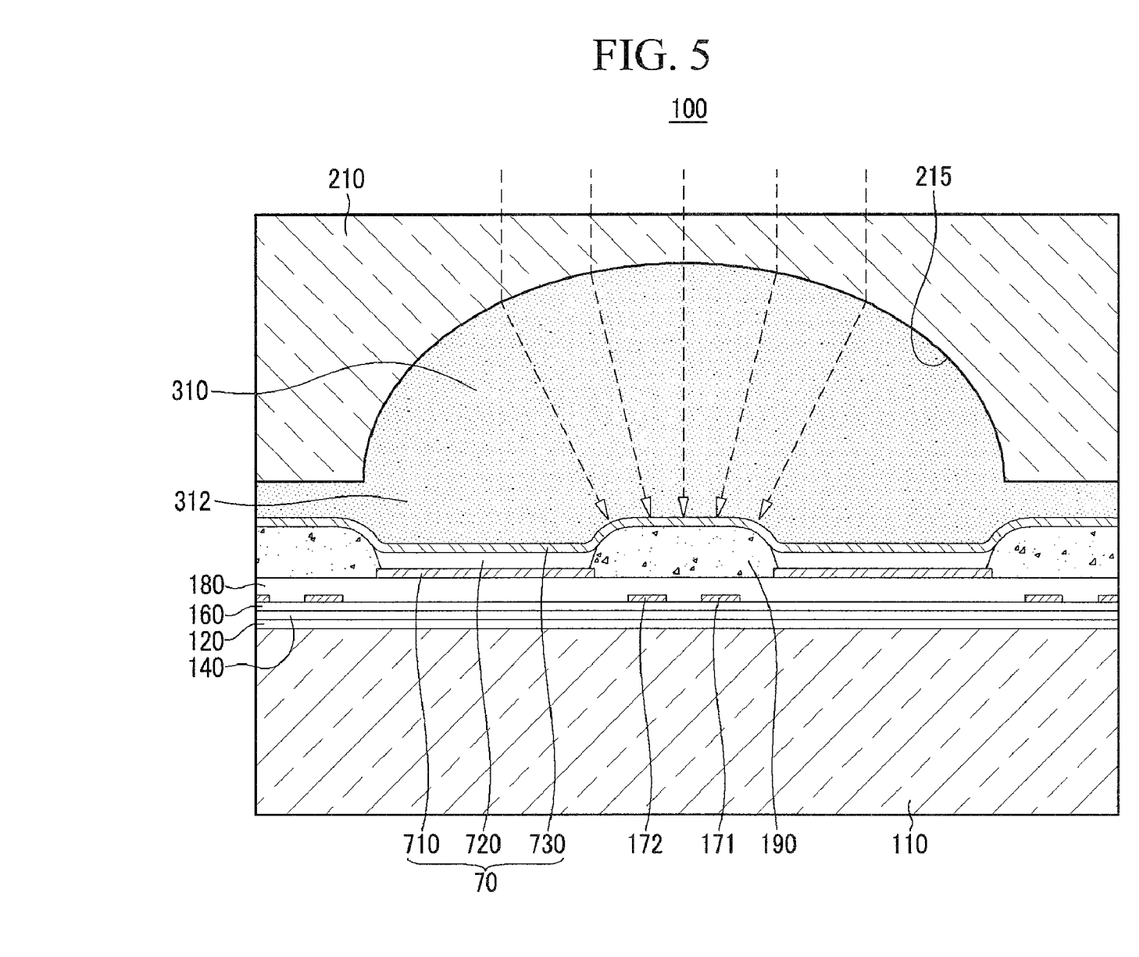
FIG. 5 is a cross-sectional view of FIG. 4, taken along the line V-V.

As shown in FIG. 5, the condenser 310 is filled in the lens container 215 of the sealing member 210. That is, a cylindrical surface or a spherical surface of the condenser 310 is substantially equivalent to that of the lens container 215. In the first exemplary embodiment of the present invention, the OLED display 100 further includes a charging member 312 interposed between the sealing member 210 and the pixel defining layer 190. In further detail, the charging member 312 is interposed between the sealing member 210 and the common electrode 730. In addition, a part of the charging member 312 may be filled in the lens container 215 of the sealing member 210 concurrently with the condenser 310. That is, the condenser 310 and the charging member 312 may be integrally formed. However, the present invention is not limited thereto, and the condenser 310 may be formed separately from the charging member 312.

In addition, a condensing area formed by the condenser 310 is configured to be located on the pixel defining layer 190. In this case, one condenser 310 covers a plurality of pixel electrodes 710, and therefore the condensing area is configured to be located on a pixel defining layer 190 interposed between the pixel electrodes 710. That is, external light having passed through the condenser 310 is condensed on the pixel defining layer 190. In the first exemplary embodiment of the present invention, the condensing area is located above the pixel defining layer 190. That is, the external light passed through the sealing member 210 is condensed above the pixel defining layer 190 through the condenser 310. Here, since the pixel defining layer 190 includes the light absorbing material, the external light condensed on the pixel defining layer 190 is absorbed rather than reflected.

The condenser 310 is made of a material with a refractive index greater than that of the sealing member 210. By using a refractive index difference between the condenser 310 and the sealing member 210, the condensing effect can be further increased.

In addition, a material of the condenser 310 may not need to be solid as long as the material has a high refractive index. Thus, the condenser 310 may be made of air, gas, or a suitable liquid material according to the refractive index of the sealing member 210.

In addition, when the charging member 312 and the condenser 310 are integrally formed, the charging member 312 and the condenser 310 have the same refractive index. On the other hand, since it is not necessary for the charging member 312 and the condenser 310 to have the same refractive index, the refractive index of the charging member 312 may be greater than or equal to that of the condenser 310 when the charging member 312 and the condenser 310 are separately formed.

In addition, in other embodiments, the common electrode 730 may not be formed on the pixel defining layer 190 below the condensing area. Accordingly, reflection of the external light in the pixel defining layer 190 below the condensing area may be more effectively suppressed or reduced.

With the above-described configuration, the OLED display 100 may have improved visibility by suppressing or reducing reflection of external light.

In other words, external light transmitted into the OLED display 100 is mostly condensed on the pixel defining layer 190 while passing through the condenser 310. The pixel defining layer 190 includes the light absorbing material, and therefore the external light condensed on the pixel defining layer 190 is mostly absorbed rather than reflected. Accordingly, display characteristics of the OLED display 100 may be improved.

Hereinafter, a second exemplary embodiment of the present invention will be described with reference to FIG. 6.

Figure 6:
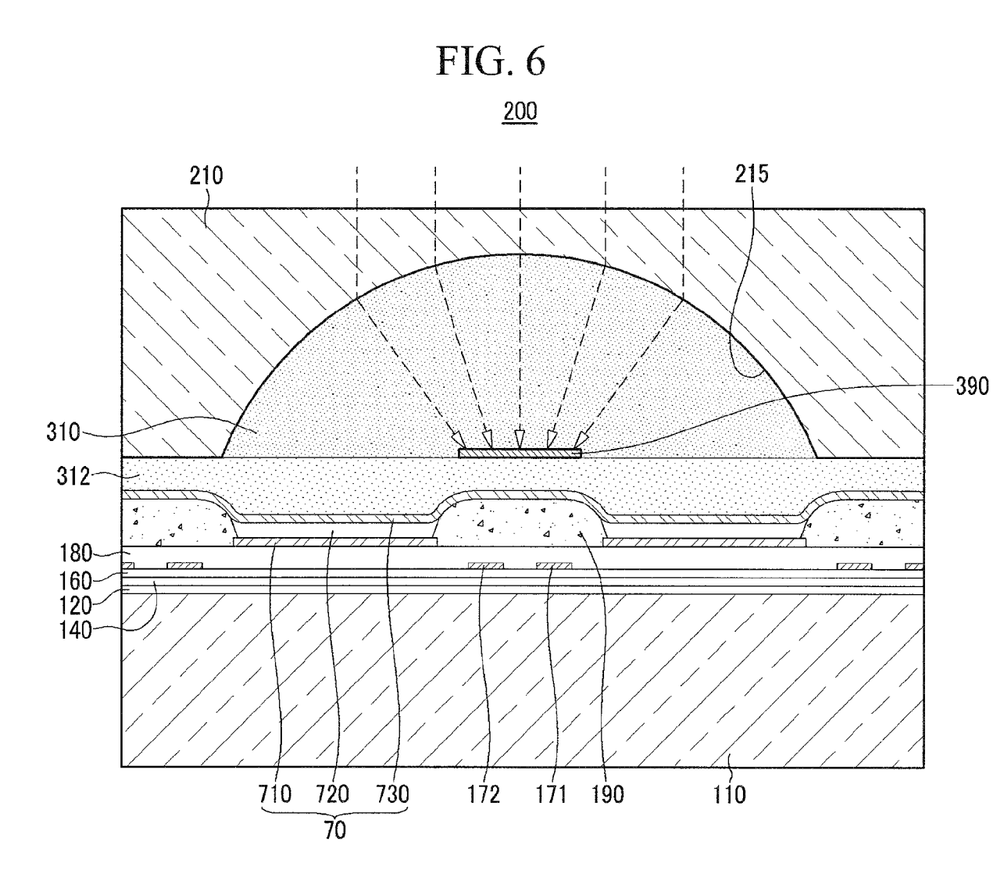
FIG. 6 is a partial cross-sectional view of an OLED display according to a second exemplary embodiment of the present invention.

As shown in FIG. 6, an OLED display 200 further includes a light blocker 390 disposed over a pixel defining layer 190. In further detail, the light blocker 390 is disposed at a condensing area formed by a condenser 310. In this case, the light blocker 390 may be disposed on an interface of the condenser 310 and a charging member 312. The light blocker 390 includes a light absorbing material and thus shields and absorbs light. Therefore, according to the second exemplary embodiment of the present invention, a pixel defining layer 190 may not include a light absorbing material.

In addition, according to the second exemplary embodiment of the present invention, the condenser 310 is made of a material with a refractive index greater than that of a sealing member 210.

When the charging member 312 and the condenser 310 are integrally formed, the charging member 312 and the condenser 310 have the same refractive index. On the other hand, since it is not necessary for the charging member 312 and the condenser 310 to have the same refractive index, the refractive index of the charging member 312 may be greater than or equal to that of the condenser 310 when the charging member 312 and the condenser 310 are separately formed.

With the above-described configuration, the OLED display 200 can have improved visibility by suppressing or reducing reflection of external light.

That is, external light transmitted into the OLED display 200 is generally condensed on the light blocker 390 after passing through the condenser 310. The external light condensed on the light blocker 390 is generally absorbed rather than reflected. Accordingly, display characteristics of the OLED display 200 may be improved.

Hereinafter, a third exemplary embodiment of the present invention will be described with reference to FIG. 7.

Figure 7:
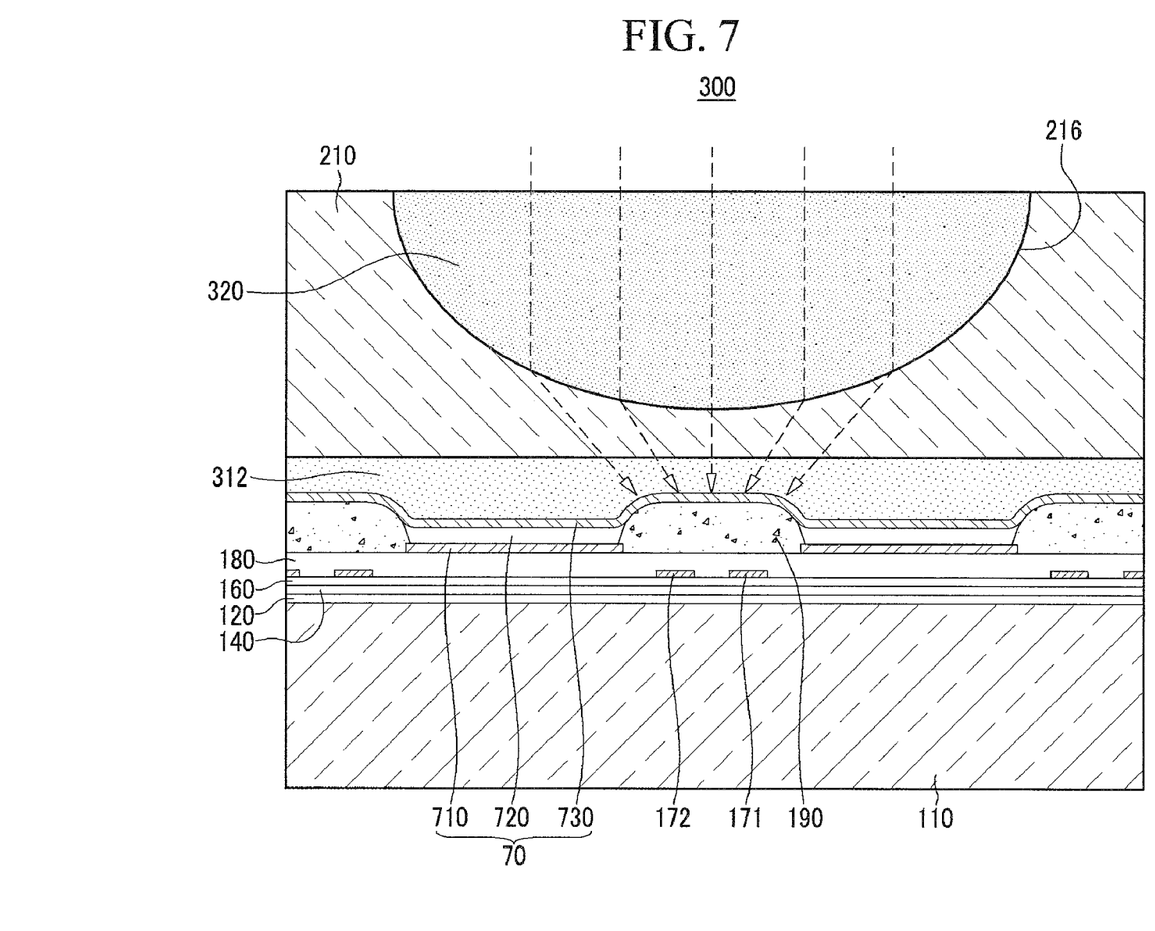
FIG. 7 is a partial cross-sectional view of an OLED display according to a third exemplary embodiment of the present invention.

As shown in FIG. 7, an OLED display 300 includes a concave lens container 216 formed on a second side of a sealing member 210. Here, the second side is opposite to a first side that faces an OLED 70 including an organic emission layer 720. In further detail, the lens container 216 becomes gradually deeper toward the center thereof, and a cross-section thereof has a half-circle or half-oval shape. In addition, the OLED display 300 further includes a condenser 320 contained in the lens container 216.

According to the third exemplary embodiment of the present invention, a condensing area is configured to be located on a pixel defining layer 190. Since one condenser 320 covers a plurality of pixel electrodes 710, the condensing area is configured to be located on a pixel defining layer 190 interposed between the pixel electrodes 710. Thus, external light having passed through the condenser 320 is passed through a sealing member 210 and condensed on the pixel defining area 190. Here, the pixel defining layer 190 includes a light absorbing material, and therefore the external light condensed on the pixel defining layer 190 is generally absorbed rather than reflected.

In addition, the condenser 320 is made of a material with a refractive index less than that of the sealing member 210. As described, the condensing effect may be further improved by using a refractive index difference between the condenser 320 and the sealing member 210.

With the above-described configuration, the OLED display 300 may have improved visibility by suppressing or reducing reflection of external light.

That is, external light transmitted into the OLED display 300 is generally condensed on the pixel defining layer 190 after passing through the condenser 320. The external light condensed on the pixel defining layer 190 is generally absorbed rather than reflected. Accordingly, display characteristics of the OLED display 300 may be improved.

Hereinafter, a fourth exemplary embodiment of the present invention will be described with reference to FIG. 8.

Figure 8:
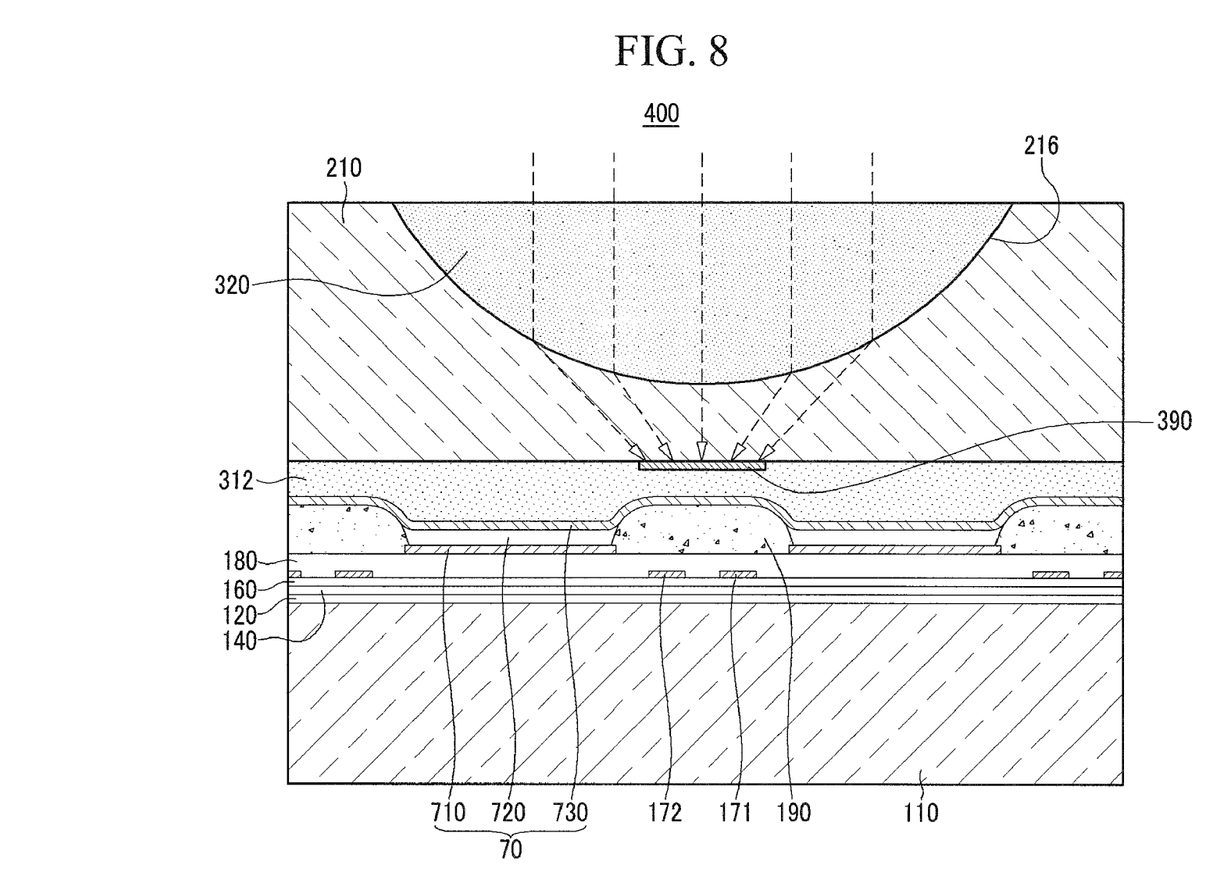
FIG. 8 is a partial cross-sectional view of an OLED display according to a fourth exemplary embodiment of the present invention.

As shown in FIG. 8, an OLED display 400 includes a lens container 216 formed on a second side of a sealing member 210. Here, the second side is opposite to a first side that faces an OLED 70 including an organic emission layer 720. In addition, the OLED display 400 further includes a condenser 320 contained in the lens container 216 and a light blocker 390 disposed over a pixel defining layer 190. In further detail, the light blocker 390 is disposed at a condensing area formed by the condenser 320. The light blocker 390 includes a light absorbing material, and thus shields and absorbs light. Therefore, the pixel defining layer 190 according to the fourth exemplary embodiment of the present invention may not include a light absorbing material.

In addition, the condenser 320 according to the fourth exemplary embodiment of the present invention is made of a material with a refractive index less than that of the sealing member 210.

With the above-described configuration, the OLED display 400 may have improved visibility by suppressing or reducing reflection of external light.

That is, external light transmitted into the OLED display 400 is generally condensed on the light blocker 390 after passing through the condenser 320. The external light condensed on the light blocker 390 is generally absorbed rather than reflected. Accordingly, display characteristics of the OLED display 400 may be improved.

In addition, according to the third and fourth exemplary embodiments, a charging member 312 is interposed between the sealing member 210 and the pixel defining layer 190, and the light blocker 390 of the fourth exemplary embodiment may be disposed on an interface of the sealing member 210 and the charging member 312. A refractive index of the charging member 312 may be greater than or equal to that of the sealing member 210.

While this invention has been described in connection with what is presently considered to be exemplary embodiments, it is to be understood that the invention is not limited to the disclosed embodiments, but is instead intended to cover various modifications and equivalent arrangements included within the spirit and scope of the appended claims.

What is claimed is:

1. An organic light emitting diode (OLED) display comprising:
    a substrate;
    a plurality of pixel electrodes on the substrate;
    a pixel defining layer on the substrate and having a plurality of openings exposing the plurality of pixel electrodes;
    a plurality of organic emission layers on corresponding pixel electrodes of the plurality of pixel electrodes;
    a sealing member including a plurality of concave lens containers and covering the plurality of organic emission layers and the pixel defining layer; and
    at least one condenser in the plurality of lens containers,
    wherein the at least one condenser is configured to form a condensing area on the pixel defining layer for each of the plurality of lens containers.

2. The OLED display of claim 1, wherein the pixel defining layer comprises a light absorbing material.

3. The OLED display of claim 1, further comprising a light blocker at each condensing area.

4. The OLED display of claim 3, further comprising a charging member between the sealing member and the pixel defining layer, wherein the light blocker at each condensing area is formed on the charging member.

5. The OLED display of claim 1, wherein the at least one condenser covers the plurality of pixel electrodes.

6. The OLED display of claim 1, wherein each of the plurality of lens containers of the sealing member has a cylindrical surface or a spherical surface, and wherein the at least one condenser is defined by the plurality of lens containers.

7. The OLED display of claim 1, wherein the at least one condenser comprises a charging member and is between the sealing member and the pixel defining layer.

8. The OLED display of claim 1, wherein the plurality of lens containers face the plurality of organic emission layers.

9. The OLED display of claim 8, wherein the at least one condenser comprises a material with a refractive index greater than a refractive index of the sealing member.

10. The OLED display of claim 1, wherein the plurality of lens containers face away from the organic emission layer.

11. The OLED display of claim 10, wherein the at least one condenser comprises a material with a refractive index less than a refractive index of the sealing member.

12. An organic light emitting diode (OLED) display comprising:
    a substrate;
    a plurality of pixel electrodes on the substrate;
    a pixel defining layer on the substrate and having a plurality of openings exposing the plurality of pixel electrodes;
    a plurality of organic emission layers on corresponding pixel electrodes of the plurality of pixel electrodes;
    a sealing member including a plurality of concave lens containers and covering the plurality of organic emission layers and the pixel defining layer; and
    a plurality of condensers in corresponding ones of the plurality of lens containers,
    wherein each of the plurality of condensers is configured to form a condensing area on the pixel defining layer.

13. The OLED display of claim 12, wherein the pixel defining layer comprises a light absorbing material.

14. The OLED display of claim 12, further comprising a charging member separating the sealing member from the pixel defining layer and the plurality of organic emission layers.

15. The OLED display of claim 12, further comprising a light blocker on the charging member at each condensing area.

16. The OLED display of claim 12, wherein each of the plurality of lens containers has a cylindrical surface or a spherical surface.

* * * * *